United States Patent [19]

Kim

[11] Patent Number: 6,025,246
[45] Date of Patent: Feb. 15, 2000

[54] METHODS FOR FABRICATING MICROELECTRONIC CAPACITOR STRUCTURES

[75] Inventor: Tae-sung Kim, Kyungki-do, Rep. of Korea

[73] Assignee: Samsung Electronics Co., Ltd., Rep. of Korea

[21] Appl. No.: 08/660,906

[22] Filed: Jun. 7, 1996

[30] Foreign Application Priority Data

Jul. 20, 1995 [KR] Rep. of Korea ................. 95-21388

[51] Int. Cl.[7] ......................................... H01L 21/8242
[52] U.S. Cl. ..................... 438/396; 438/253; 438/254; 438/397
[58] Field of Search ................... 438/396, 398, 438/253, 254, 397, 255

[56] References Cited

U.S. PATENT DOCUMENTS

| | | | |
|---|---|---|---|
| 5,330,614 | 7/1994 | Ahn | 156/631 |
| 5,429,980 | 7/1995 | Yang et al. | 438/396 |
| 5,670,407 | 9/1997 | Tseng | 438/396 |
| 5,681,774 | 10/1997 | Tseng | 438/398 |
| 5,733,808 | 3/1998 | Tseng | 438/396 |
| 5,792,693 | 8/1998 | Tseng | 438/396 |
| 5,824,592 | 10/1998 | Tseng | 438/396 |
| 5,834,349 | 11/1998 | Tseng | 438/396 |
| 5,837,575 | 11/1998 | Tseng | 438/253 |
| 5,946,571 | 8/1999 | Hsue et al. | 438/255 |

FOREIGN PATENT DOCUMENTS

| | | |
|---|---|---|
| 91-15250 | 8/1991 | Rep. of Korea . |
| 9115250 | 8/1991 | Rep. of Korea . |

*Primary Examiner*—Carl Whitehead, Jr
*Assistant Examiner*—Toniae M. Thomas
*Attorney, Agent, or Firm*—Myers Bigel Sibley & Sajovec

[57] ABSTRACT

A method of fabricating a capacitor includes the steps of forming a layer of a conductive material on a substrate, and forming a patterned oxidation resisting layer on the conductive layer thereby defining exposed and unexposed portions of the conductive layer. The exposed portion of the conductive layer can be selectively oxidized thereby defining an oxide etch mask covering the exposed portions of the conductive layer. Portions of the conductive layer not covered by the oxide etch mask can be selectively etched thereby defining a vertical structure of the conductive material extending from the microelectronic substrate. This vertical structure can be coated with a dielectric layer, and a second conductive layer can be formed on the dielectric layer.

22 Claims, 6 Drawing Sheets

METHODS FOR FABRICATING MICROELECTRONIC CAPACITOR STRUCTURES

FIELD OF THE INVENTION

The present invention relates to the field of microelectronics and more particularly to the field of fabricating microelectronic capacitor structures.

BACKGROUND OF THE INVENTION

In the design of dynamic random access memories (DRAMs), there is a drive to increase integration by reducing the surface area of the substrate occupied by each memory cell. Accordingly, there is a drive to reduce the size of the capacitor used in each memory cell. A reduction in size of the capacitor, however, may reduce the read/write capability of each memory cell and also increase the soft error rate. In addition, a smaller capacitor makes it difficult to operate a DRAM at a low voltage thus increasing the power consumed by the memory. Thus, there is a need in the art to reduce the size of capacitors in memory cells without significantly reducing the capacitance.

One approach to this problem has been to increase the electrostatic capacity of a capacitor per unit surface area of a substrate occupied. For example, there has been proposed a capacitor having a cylindrical structure in which inner and outer regions of the cylindrical structure are used to increase the surface area of an electrode (or plate) of the capacitor so that the capacitance can be increased.

In particular, Korean Patent Application No. 91-15250 discusses a method for fabricating a capacitor having a cylindrical structure. This method is described with reference to FIGS. 1A–1G.

Figure 1A:
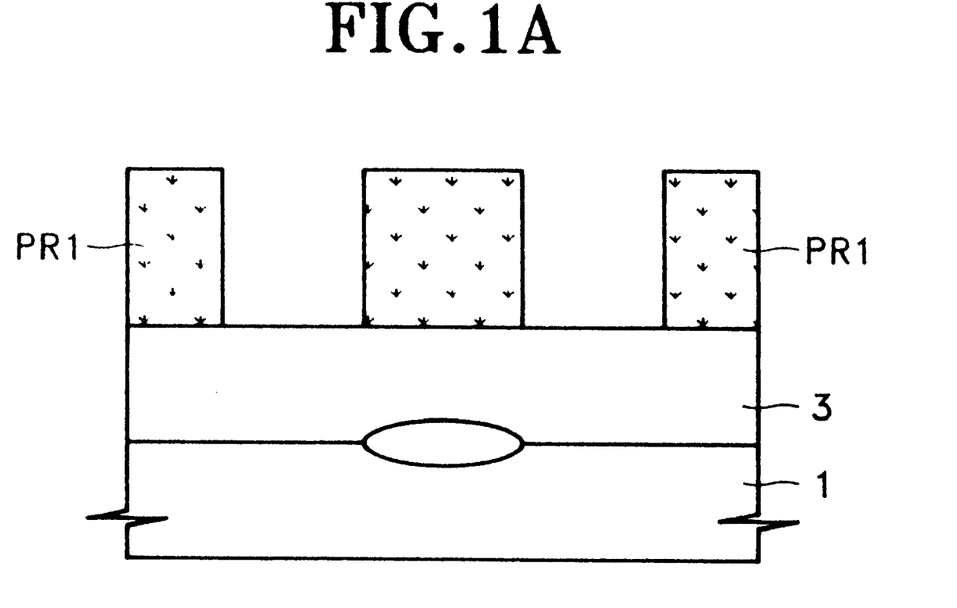
FIGS. 1A–1G are cross-sectional views illustrating sequential steps in a method for fabricating a capacitor according to the prior art.

In FIG. 1A, the semiconductor substrate 1 includes at least one transistor. An insulating layer 3 is formed on the semiconductor substrate 1, and a photoresist pattern PR1 is formed on the insulating layer 3 using a photolithographic process.

Figure 1B:
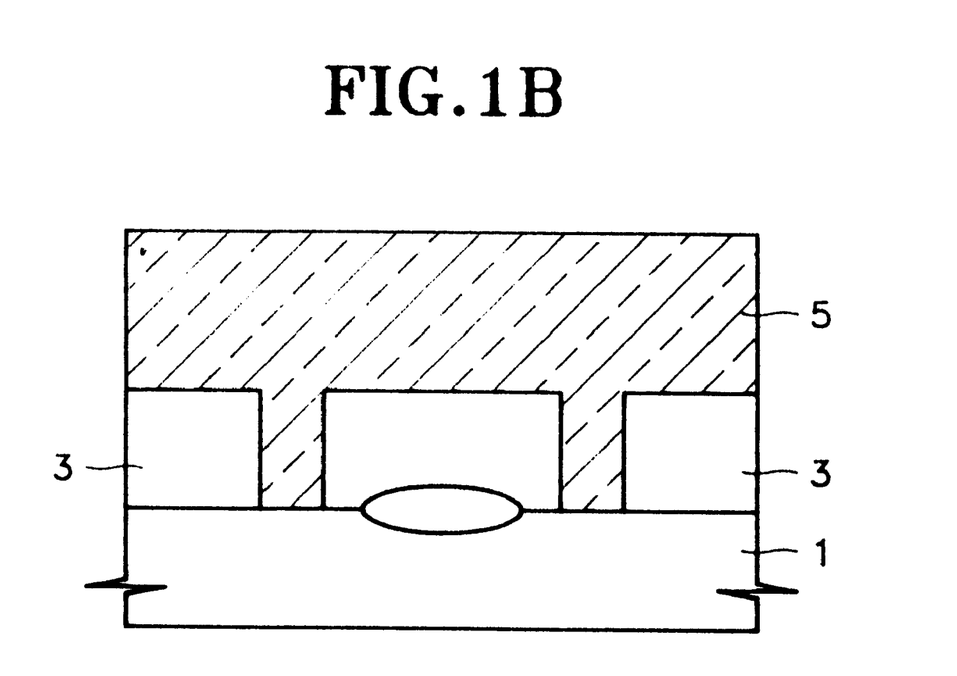

In FIG. 1B, a contact hole is formed in the insulating layer 3, and this contact hole provides contact with a storage node. The insulating layer 3 may be dry-etched by using the photoresist pattern PR1 to form a contact hole. The resist pattern PR1 can then be removed and a polysilicon layer 5 can be deposited.

Figure 1C:
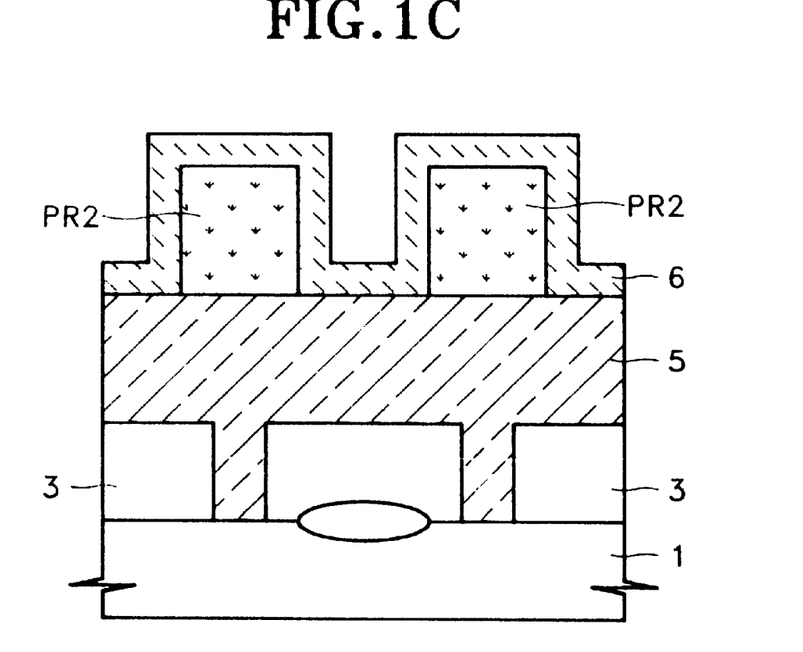
Figure 1D:
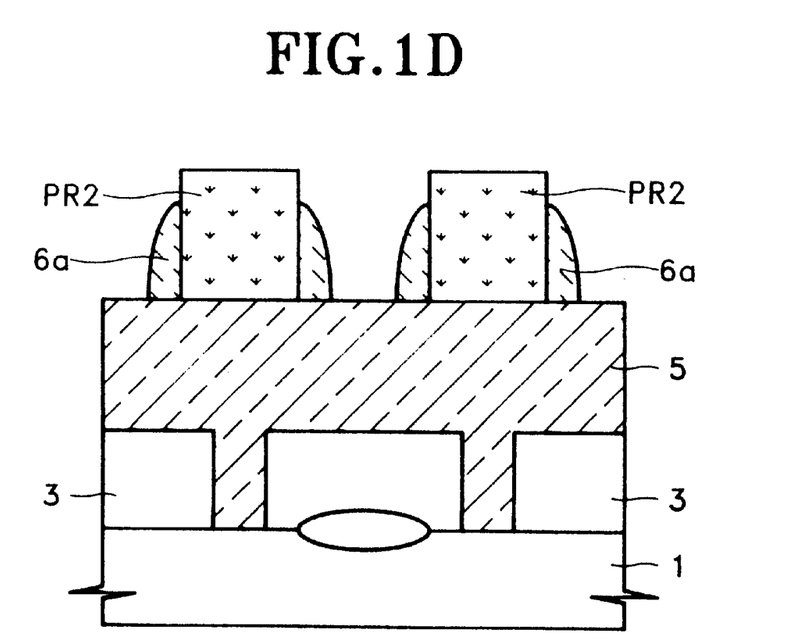
Figure 1E:
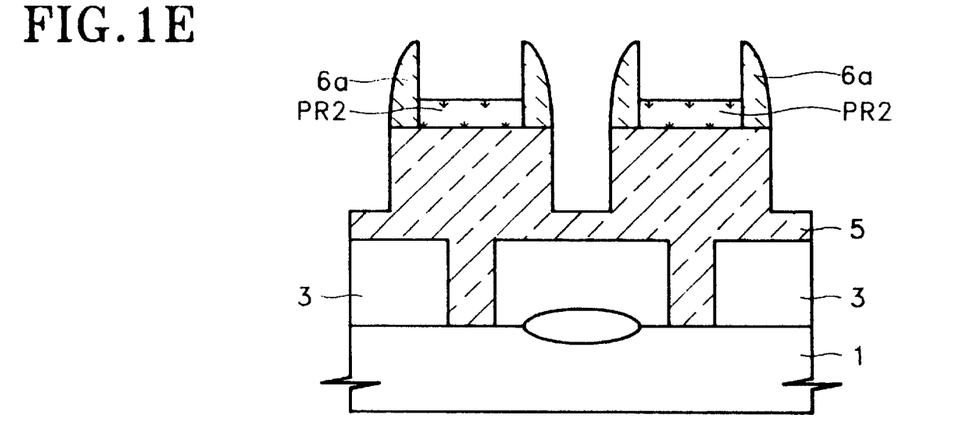

The step of forming an etching mask for a cylindrical node pattern is illustrated in FIGS. 1C and 1D. As shown in FIG. 1C, a photoresist pattern PR2 and an oxide layer 6 are formed on the polysilicon layer 5. The oxide layer 6 is then anisotropically etched to form spacers 6a on both sidewalls of the resist pattern PR2. As shown in FIG. 1E, an outer surface of a cylinder is formed by etching portions of the polysilicon layer 5 which are not covered by the resist pattern PR2 or the oxide spacer 6a. The thickness of the resist pattern PR2 may also be reduced during this etching step.

Figure 1F:
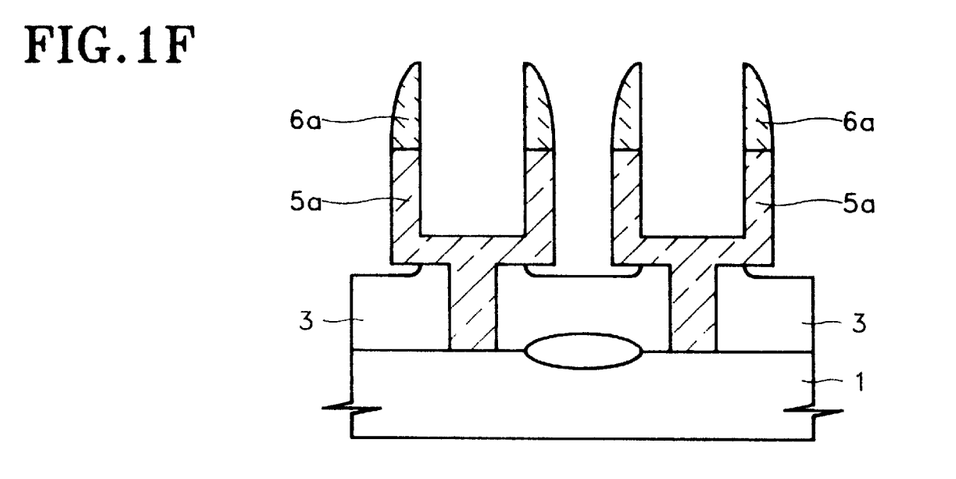
Figure 1G:
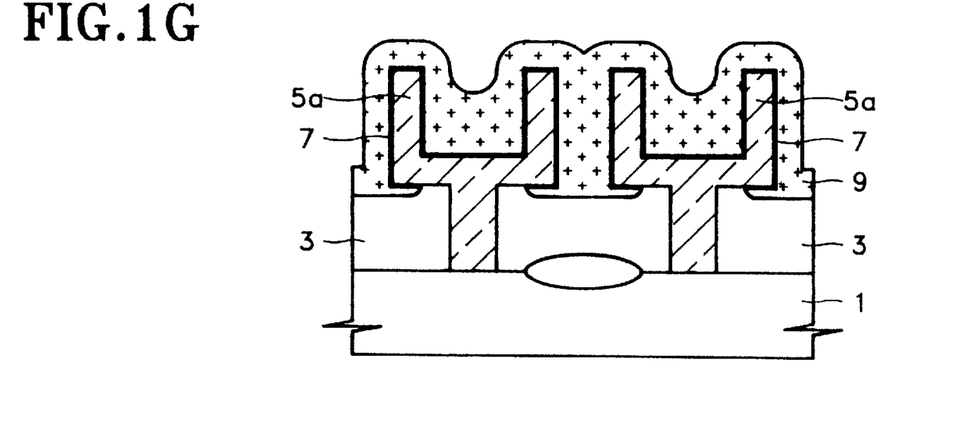

The step of forming an inner surface of the cylinder is illustrated in FIG. 1F. The remaining portion of the resist pattern PR2 is removed and then the exposed portion of the polysilicon layer 5 is further etched by a dry-etching method, thereby forming the cylindrical storage electrode 5a. The spacers 6a are then removed as illustrated in FIG. 1G. A thin dielectric layer 7 is formed on the surface of the cylindrical storage electrode 5a, and a polysilicon layer 9 is formed on the surface of the resulting structure. A second polysilicon layer 9 forms a top electrode (or plate electrode) of the cylindrical capacitor structure.

In the method discussed above, however, it may be difficult to reproducibly form the spacers 6a which determine the pattern of the first capacitor electrode 5a. This difficulty may result because the photoresist layer PR2 may be deformed during the deposition of the material used to form the spacers 6a. For example, portions of the photoresist may be deformed or destroyed as a result of a high temperature deposition. In addition, it may be difficult to form a capacitor electrode 5a having the desired width and uniformity. This difficulty may result because the width of the spacer 6a is determined by the resolution of the photolithography process used, and because when the oxide layer 6 is anisotropically etched, the etch rate may not be uniform across the substrate.

SUMMARY OF THE INVENTION

It is therefore an object of the present invention to provide improved methods for fabricating a microelectronic capacitor structure.

It is another object of the present invention to provide methods for fabricating a microelectronic capacitor structure having increased capacitance.

It is still another object of the present invention to provide methods for fabricating a microelectronic capacitor structure having relatively fine geometries.

These and other objects can be provided according to the present invention by a method including the steps of forming a layer of a conductive material on a substrate, and forming a patterned oxidation resisting layer on the conductive layer thereby defining exposed and unexposed portions of the conductive layer. The exposed portion of the conductive layer is selectively oxidized thereby defining an oxide etch mask covering the exposed portions of the conductive layer. Portions of the conductive layer not covered by the oxide etch mask are selectively etched thereby defining a vertical structure of the conductive material extending from the microelectronic substrate. This vertical structure can be coated with a dielectric layer, and a second conductive layer can be formed on the dielectric layer to define a capacitor. This method thus allows the fabrication of capacitors having increased capacitance per unit surface area of the substrate. Accordingly, these capacitors can be advantageously used in memory cells for dynamic random access memories having increased integration.

In addition, the step of selectively oxidizing the conductive layer can be preceded by the formation of a depression in the exposed portion of the conductive layer so that side walls of the conductive layer are defined adjacent the patterned oxidation resisting layer. Accordingly, the oxide etch mask includes an inner oxide layer along the depression of the conductive layer and an outer oxide layer along the side walls. Accordingly, the oxide etch mask is thinner along the depression and thicker along the side walls.

With the thicker side wall portions, the oxide etch mask can be partially etched to remove the inner oxide layer while retaining at least a portion of the outer oxide layer. Thus, an inner portion of the conductive material can be selectively etched using the remaining portion of the outer oxide layer. Accordingly, the vertical structure can have an inner surface and an outer surface thereby increasing the surface area of the capacitor electrode. Furthermore, the width of this vertical structure is determined by the oxidizing step as opposed to a photolithography step.

The conductive material may comprise doped polycrystalline silicon, and the oxidation resisting layer may comprise a layer of silicon nitride. Furthermore, the dielectric layer may comprise a multi-layer oxide/nitride structure, and the step of selectively etching the conductive layer may comprise anisotropically etching portions of the conductive layer not covered by the oxide etch mask.

The methods of the present invention thus allow the fabrication of capacitor structures having increased capacitance per unit area. The use of these capacitors in microelectronic memory devices allows for increased integration. Furthermore, the methods of the present invention provide improved capacitor structures with relatively fine geometries which can be accurately reproduced.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

Figure 2A:
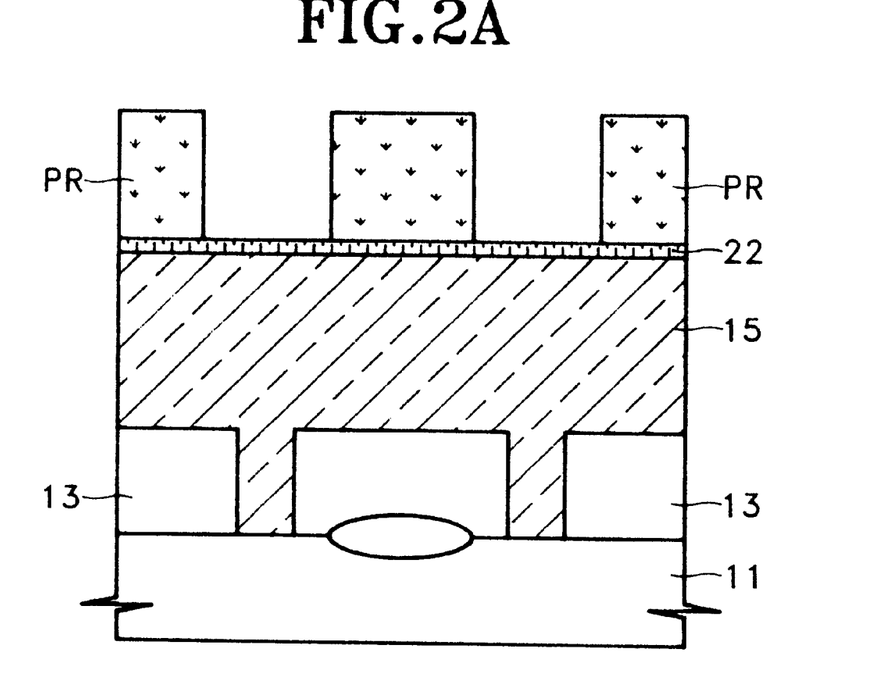
FIGS. 2A–2H are cross-sectional views illustrating sequential steps of a method for fabricating a capacitor according to the present invention.

A method of fabricating a memory device according to the present invention is illustrated in FIGS. 2A–H. In FIG. 2A, the semiconductor substrate 11 can be divided into active and inactive regions, and transistors can be formed in an active region of the substrate 11. Next, an insulating layer 13 can be formed over the semiconductor substrate 11. This insulating layer may insulate and planarize the transistors formed in the substrate.

A contact hole is formed in the insulating layer 13 to bring a storage electrode in contact with a transistor in an active region of the substrate 11. A conductive layer 15 and an oxidation resisting layer 22 are sequentially deposited on the insulating layer 13, and the conductive layer 15 extends through the contact hole to the substrate 11. A photoresist pattern PR is also formed to pattern the oxidation resisting layer 22. The conductive layer 15 can be formed by depositing a conductive material such as doped polycrystalline silicon. As will be understood by one having skill in the art, a polycrystalline silicon layer doped with impurities can be formed by using a method such as chemical vapor deposition (CVD). This conductive layer 15 has a thickness that is at least enough to fill the contact hole.

The oxidation resisting layer 22 can be formed by depositing silicon nitride on the conductive layer 15 using a CVD method. This oxidation resisting layer 22 restrains the oxidation of the conductive layer 15.

The conductive layer 15 can be formed by depositing polycrystalline silicon doped with impurities so as to have a high conductivity and to be readily oxidized. In addition, the conductive layer 15 preferably has a thickness greater than that required for the resulting storage electrode. This greater thickness allows the consumption of a portion of the polysilicon layer due to subsequent partial etching and oxidizing steps. Accordingly, the conductive layer 15 should be thick enough to compensate for the etching and oxidizing steps.

Figure 2B:
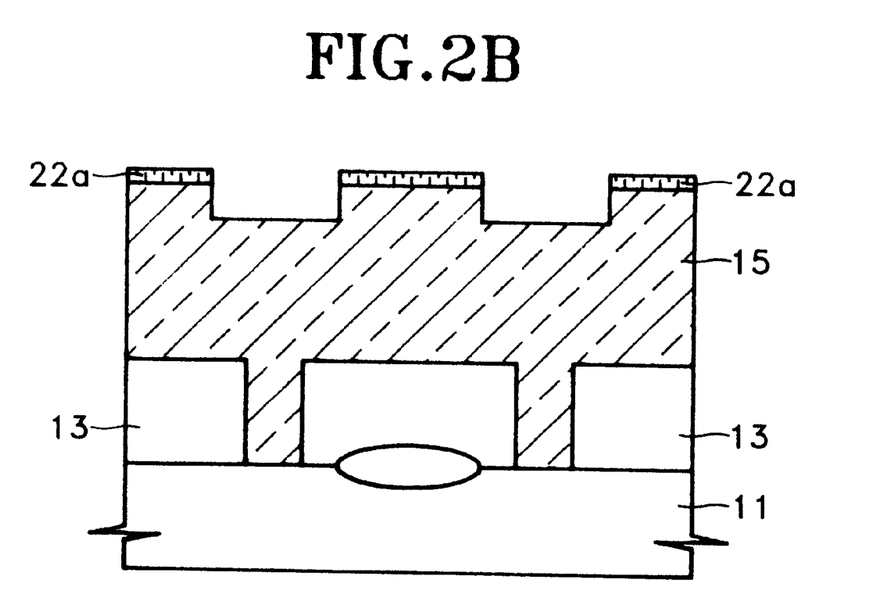

In FIG. 2B, the oxidation resisting layer 22 is patterned. In particular, exposed portions of the oxidation resisting layer 22 and the conductive layer 15 can be etched through a dry-etching process using the resist pattern PR as a mask. The resist pattern PR is then removed leaving the patterned oxidation resisting layer 22a. Part of the conductive layer 15 is also etched thereby allowing fine control of the width of a side wall portion of an oxide layer formed as discussed below. Accordingly, the width of a storage electrode can be determined by the oxidation of the exposed side walls of the conductive layer 15. The width of the oxidation of these exposed side walls can thus be finely controlled.

Figure 2C:
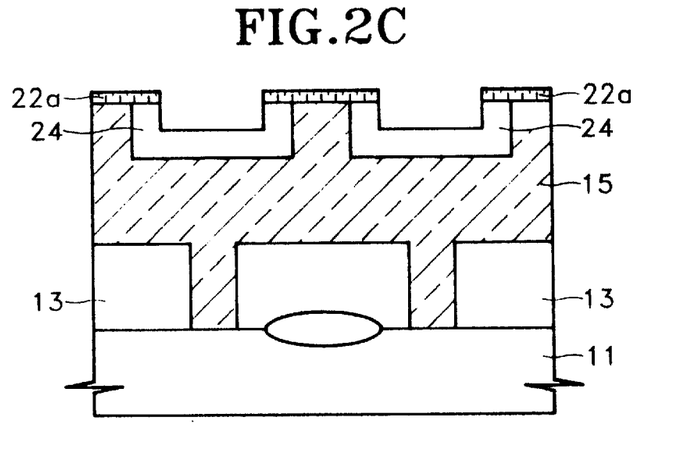

In FIG. 2C, a thermal oxide layer 24 is formed on the portions of the conductive layer 15 exposed by the oxidation resisting layer 22a. In particular, the oxidation resisting layer 22a resists the oxidation of the portions of the conductive layer 15 which are covered thereby. A high temperature diffusion furnace or a rapid thermal processor (RTP) can be used to form the oxide layer 24.

As illustrated in FIGS. 2B and 2C, the partial etching of the conductive layer 15 forms a depression in the conductive layer and side walls adjacent the patterned oxidation resisting layer 22a. Accordingly, the oxide layer 24 includes an inner oxide layer along the depression and an outer oxide layer along the side walls. The vertical thickness of the outer oxide layer is thus thicker than that of the inner oxide layer. The width of the outer oxide layer along the side walls is determined by the oxidizing step. Accordingly, this width can be thin relative to that which may be possible using conventional photolithography steps.

The resulting oxide layer 24 has a smooth side surface without a bird's beak. Accordingly, the extent to which the exposed side walls of the conductive layer 15 are oxidized determines the width of the storage electrode to be formed. The degree of oxidation can thus be controlled according to process factors such as pressure, temperature, and flux. The oxide layer 24 thus formed is used as an etching mask to define portions of the conductive layer 15 to be etched. In particular, an anisotropic etch can be used to selectively etch portions of the conductive layer not covered by the oxide etch mask.

Figure 2D:
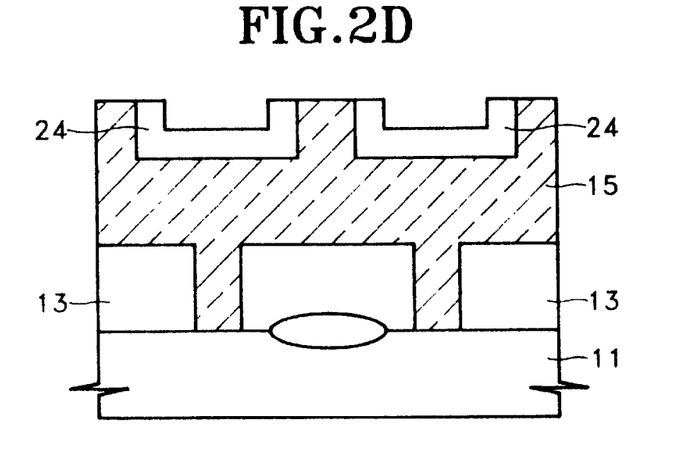
Figure 2E:
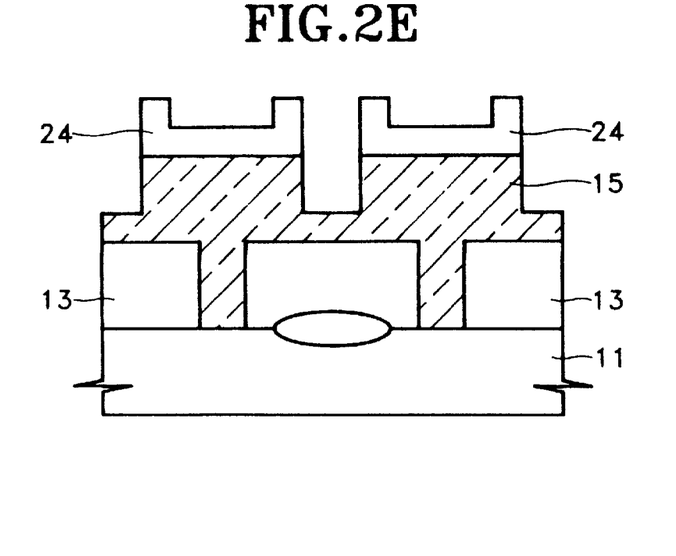

The oxidation resisting layer 22a can then be removed as shown in FIG. 2D. This layer can be removed through a wet-etch using an etchant such as phosphoric acid or through a dry-etch. The formation of the outer surface of a cylindrical storage electrode is shown in FIG. 2E. In particular, a dry-etch can be performed using the oxide layer 24 as an etching mask. The exposed portion of the conductive layer 15 is thus selectively etched forming an outer surface of the storage electrode.

Figure 2F:
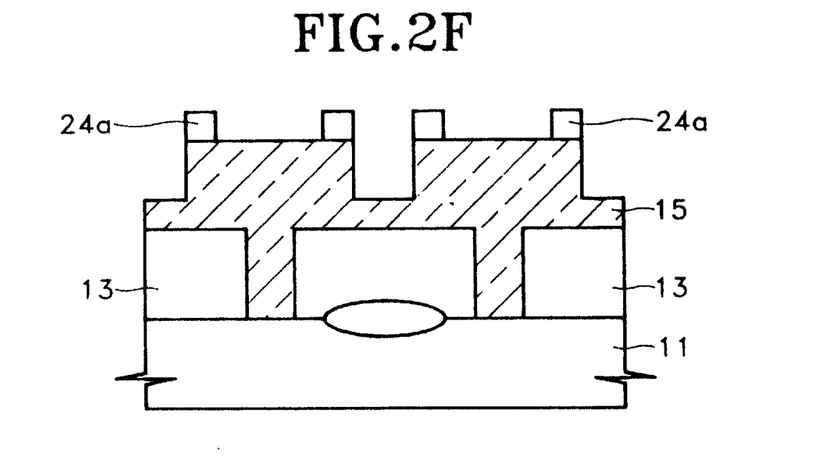

In FIG. 2F, the oxide layer 24 is partially etched to remove the thinner inner oxide layer while preserving a portion of the thicker outer oxide layer or oxide side walls 24a. As discussed above, the outer portion of the oxide layer is thicker than the inner portion because a depression was formed in the conductive layer prior to oxidation By timing the etch, the thinner portion of the oxide layer can be removed while part of the thicker portion of the oxide layer can be preserved.

Figure 2G:
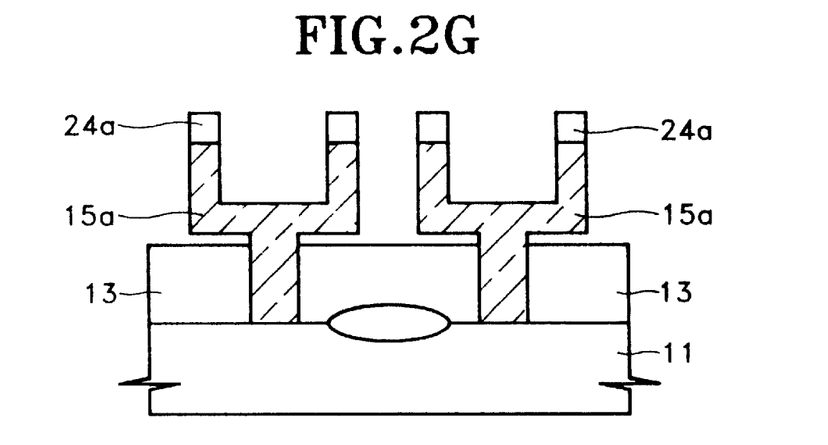
Figure 2H:
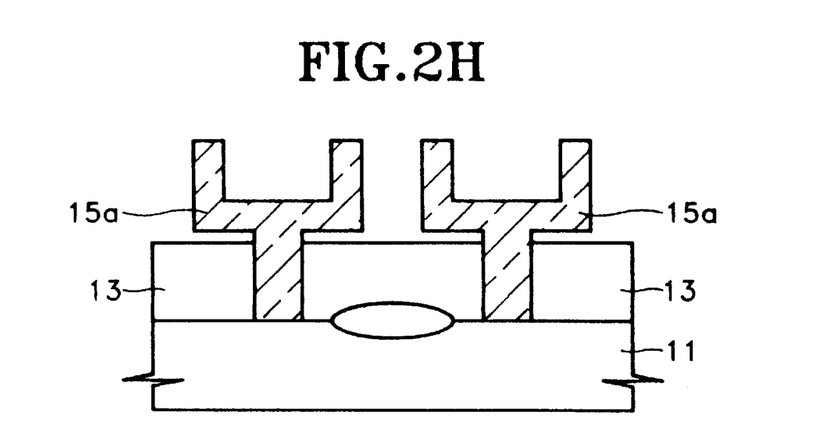

The exposed portions of the conductive layer 15 can be dry-etched in FIG. 2G using the remaining portions of the oxide layer 24a as a mask. Accordingly, an inner surface of the storage electrode can be formed. The remaining portion of the oxide layer 24a is removed and the resulting storage electrode 15a is illustrated in FIG. 2H.

As shown in FIG. 1G, a dielectric layer and a top electrode can be formed on the storage electrode to complete the capacitor. In particular, the dielectric layer may have a multi-layer structure such as an oxide/nitride/oxide (O/N/O) structure coated on the surface of the storage electrode 15a. A conductive material such as polycrystalline silicon doped with impurities can then be deposited on the dielectric layer to form the top electrode (or plate electrode).

A capacitor formed according to the method discussed above has the following advantages. The width of a cylindrical storage electrode can be determined by the width of a thermal oxide formed on sidewalls of a conductive layer which can be controlled to relatively fine dimensions. Accordingly, storage electrodes can be fabricated having a width which may be difficult to obtain using conventional photolithography steps. This method also eliminates the need to use a spacer structure formed against a resist pattern. Accordingly, a resist pattern is not damaged or deformed during the formation of a spacer, thus increasing the reproducibility of capacitors formed according to the present invention.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of fabricating a capacitor comprising the steps of:
   forming a layer of a conductive material on a substrate;
   forming a patterned oxidation resisting layer on said layer of said conductive material thereby defining exposed and unexposed portions of said layer of said conductive material;
   forming a depression in said exposed portion of said layer of said conductive material so that sidewalls of said layer of said conductive material are defined adjacent said patterned oxidation resisting layer;
   after forming said depression, selectively oxidizing said exposed portion of said layer of said conductive material thereby defining an oxide etch mask covering said exposed portions of said layer of said conductive material so that said oxide etch mask comprises an inner oxide layer along said depression of said layer of said conductive material and an outer oxide layer along said sidewalls;
   selectively etching portions of said layer of said conductive material not covered by said oxide etch mask thereby defining a vertical structure of said conductive material extending from said substrate;
   coating said vertical structure of said conductive material with a dielectric layer; and
   forming a second conductive layer on said dielectric layer.

2. A method according to claim 1 further comprising the steps of:
   partially etching said oxide etch mask to remove said inner oxide layer while retaining at least a portion of said outer oxide layer; and
   selectively etching an inner portion of said vertical structure of said conductive material not covered by said remaining portion of said outer oxide layer so that said vertical structure has an inner surface and an outer surface.

3. A method according to claim 1 further comprising the step of removing said patterned oxidation resisting layer.

4. A method according to claim 1 wherein said conductive material comprises doped polycrystalline silicon.

5. A method according to claim 1 wherein said oxidation resisting layer comprises a layer of silicon nitride.

6. A method according to claim 1 wherein said dielectric layer comprises a multi-layer oxide/nitride structure.

7. A method according to claim 1 wherein said step of selectively etching said layer of said conductive material comprises anisotropically etching portions of said layer of said conductive material not covered by said oxide etch mask.

8. A method of fabricating a memory device including a capacitor, said method comprising the steps of:
   forming a layer of a conductive material on a substrate which electrically contacts a memory cell transistor;
   forming a patterned oxidation resisting layer on said layer of said conductive material thereby defining exposed and unexposed portions of said layer of said conductive material;
   forming a depression in said exposed portion of said layer of said conductive material so that sidewalls of said layer of said conductive material are defined adjacent said patterned oxidation resisting layer;
   after said step of forming said depression, selectively oxidizing said exposed portion of said layer of said conductive material thereby defining an oxide etch mask covering said exposed portions of said layer of said conductive material so that said oxide etch mask comprises an inner oxide layer along said depression of said layer of said conductive material and an outer oxide layer along said sidewalls;
   selectively etching portions of said layer of said conductive material not covered by said oxide etch mask thereby defining a vertical structure of said conductive material extending from said substrate;
   coating said vertical structure of said conductive material with a dielectric layer; and
   forming a second conductive layer on said dielectric layer.

9. A method according to claim 8 further comprising the steps of:
   partially etching said oxide etch mask to remove said inner oxide layer while retaining at least a portion of said outer oxide layer; and
   selectively etching an inner portion of said vertical structure of said conductive material not covered by said remaining portion of said outer oxide layer so that said vertical structure has an inner surface and an outer surface.

10. A method according to claim 8 further comprising the step of removing said patterned oxidation resisting layer.

11. A method according to claim 8 wherein said conductive material comprises doped polycrystalline silicon.

12. A method according to claim 8 wherein said oxidation resisting layer comprises a layer of silicon nitride.

13. A method according to claim 8 wherein said dielectric layer comprises a multi-layer oxide/nitride structure.

14. A method according to claim 8 wherein said step of selectively etching said layer of said conductive material comprises anisotropically etching portions of said layer of said conductive material not covered by said oxide etch mask.

15. A method of fabricating a microelectronic structure comprising the steps of:
   forming a layer of a conductive material on a microelectronic substrate;

forming a patterned oxidation resisting layer on said layer of said conductive material thereby defining exposed and unexposed portions of said layer of said conductive material;

forming a depression in said exposed portion of said layer of said conductive material so that sidewalls of said layer of said conductive material are defined adjacent said patterned oxidation resisting layer;

after said step of forming said depression, selectively oxidizing said exposed portion of said layer of said conductive material thereby defining an oxide etch mask covering said exposed portions of said layer of said conductive material so that said oxide etch mask comprises an inner oxide layer along said depression of said layer of said conductive material and an outer oxide layer along said sidewalls; and selectively etching portions of said layer of said conductive material not covered by said oxide etch mask thereby defining a vertical structure of said conductive material extending from said microelectronic substrate.

16. A method according to claim 15 further comprising the steps of:

partially etching said oxide etch mask to remove said inner oxide layer while retaining at least a portion of said outer oxide layer; and selectively etching an inner portion of said vertical structure of said conductive material not covered by said remaining portion of said outer oxide layer so that said vertical structure has an inner surface and an outer surface.

17. A method according to claim 15 further comprising the step of removing said patterned oxidation resisting layer.

18. A method according to claim 15 wherein said conductive material comprises doped polycrystalline silicon.

19. A method according to claim 15 wherein said oxidation resisting layer comprises a layer of silicon nitride.

20. A method according to claim 15 further comprising the steps of:

coating said vertical structure of said conductive material with a dielectric layer; and forming a second conductive layer on said dielectric layer.

21. A method according to claim 20 wherein said dielectric layer comprises a multi-layer oxide/nitride structure.

22. A method according to claim 15 wherein said step of selectively etching said layer of said conductive material comprises anisotropically etching portions of said layer of said conductive material not covered by said oxide etch mask.

* * * * *